United States Patent
Rathweg et al.

(10) Patent No.: US 8,207,006 B1
(45) Date of Patent: Jun. 26, 2012

(54) VAPOR DEPOSITION APPARATUS AND PROCESS FOR CONTINUOUS DEPOSITION OF A THIN FILM LAYER ON A SUBSTRATE

(75) Inventors: Christopher Rathweg, Louisville, CO (US); Max William Reed, Niwot, CO (US); Mark Jeffrey Pavol, Arvada, CO (US)

(73) Assignee: PrimeStar Solar, Inc., Arvada, CO (US)

( * ) Notice: Subject to any disclaimer, the term of this patent is extended or adjusted under 35 U.S.C. 154(b) by 0 days.

(21) Appl. No.: 13/447,534

(22) Filed: Apr. 16, 2012

Related U.S. Application Data

(62) Division of application No. 12/639,043, filed on Dec. 16, 2009, now Pat. No. 8,163,089.

(51) Int. Cl.
*H01L 21/00* (2006.01)

(52) U.S. Cl. ........ 438/57; 438/48; 438/61; 257/E21.001

(58) Field of Classification Search ............... 438/48, 438/57, 61; 257/E21.001
See application file for complete search history.

(56) References Cited

U.S. PATENT DOCUMENTS

| | | |
|---|---|---|
| 4,976,217 A | 12/1990 | Frijlink |
| 5,147,498 A | 9/1992 | Nashimoto |
| 5,248,349 A | 9/1993 | Foote et al. |
| 5,288,515 A | 2/1994 | Nakamura et al. |
| 5,304,499 A | 4/1994 | Bonnet et al. |
| 5,334,251 A | 8/1994 | Nashimoto |
| 5,366,764 A | 11/1994 | Sunthankar |
| 5,712,187 A | 1/1998 | Li et al. |
| 5,994,642 A | 11/1999 | Higuchi et al. |
| 6,171,641 B1 | 1/2001 | Okamoto et al. |
| 6,214,116 B1 | 4/2001 | Shin |
| 6,258,620 B1 * | 7/2001 | Morel et al. .......... 438/57 |
| 6,368,891 B1 * | 4/2002 | De Haan ............. 438/57 |
| 6,423,565 B1 | 7/2002 | Barth et al. |
| 6,444,043 B1 | 9/2002 | Gegenwart et al. |
| 6,506,291 B2 | 1/2003 | Tsai et al. |
| 6,719,848 B2 | 4/2004 | Faykosh et al. |

(Continued)

FOREIGN PATENT DOCUMENTS

DE 2436431 2/1976

(Continued)

OTHER PUBLICATIONS

European Search Report, Dec. 7, 2010.

*Primary Examiner* — Angel Roman

(74) *Attorney, Agent, or Firm* — Dority & Manning, P.A.

(57) ABSTRACT

An apparatus and related process are provided for vapor deposition of a sublimated source material as a thin film on a photovoltaic (PV) module substrate. A receptacle is disposed within a vacuum head chamber and is configured for receipt of a source material. A heated distribution manifold is disposed below the receptacle and includes a plurality of passages defined therethrough. The receptacle is indirectly heated by the distribution manifold to a degree sufficient to sublimate source material within the receptacle. A molybdenum distribution plate is disposed below the distribution manifold and at a defined distance above a horizontal plane of a substrate conveyed through the apparatus. The molybdenum distribution plate includes a pattern of holes therethrough that further distribute the sublimated source material passing through the distribution manifold onto the upper surface of the underlying substrate. The molybdenum distribution plate includes greater than about 75% by weight molybdenum.

20 Claims, 4 Drawing Sheets

U.S. PATENT DOCUMENTS

| | | |
|---|---|---|
| 6,899,764 B2 | 5/2005 | Frijlink |
| 7,194,197 B1 | 3/2007 | Wendt et al. |
| 2002/0017244 A1 | 2/2002 | Sillmon et al. |
| 2002/0117199 A1 | 8/2002 | Oswald |
| 2003/0044539 A1 | 3/2003 | Oswald |
| 2009/0194165 A1 | 8/2009 | Murphy et al. |
| 2010/0167461 A1* | 7/2010 | Rana et al. ................ 438/97 |
| 2010/0243437 A1 | 9/2010 | Gessert et al. |
| 2011/0136286 A1* | 6/2011 | Stewart et al. ............. 438/57 |

FOREIGN PATENT DOCUMENTS

| | | |
|---|---|---|
| EP | 0853345 A1 | 7/1998 |
| JP | 2002184790 | 6/2002 |

\* cited by examiner

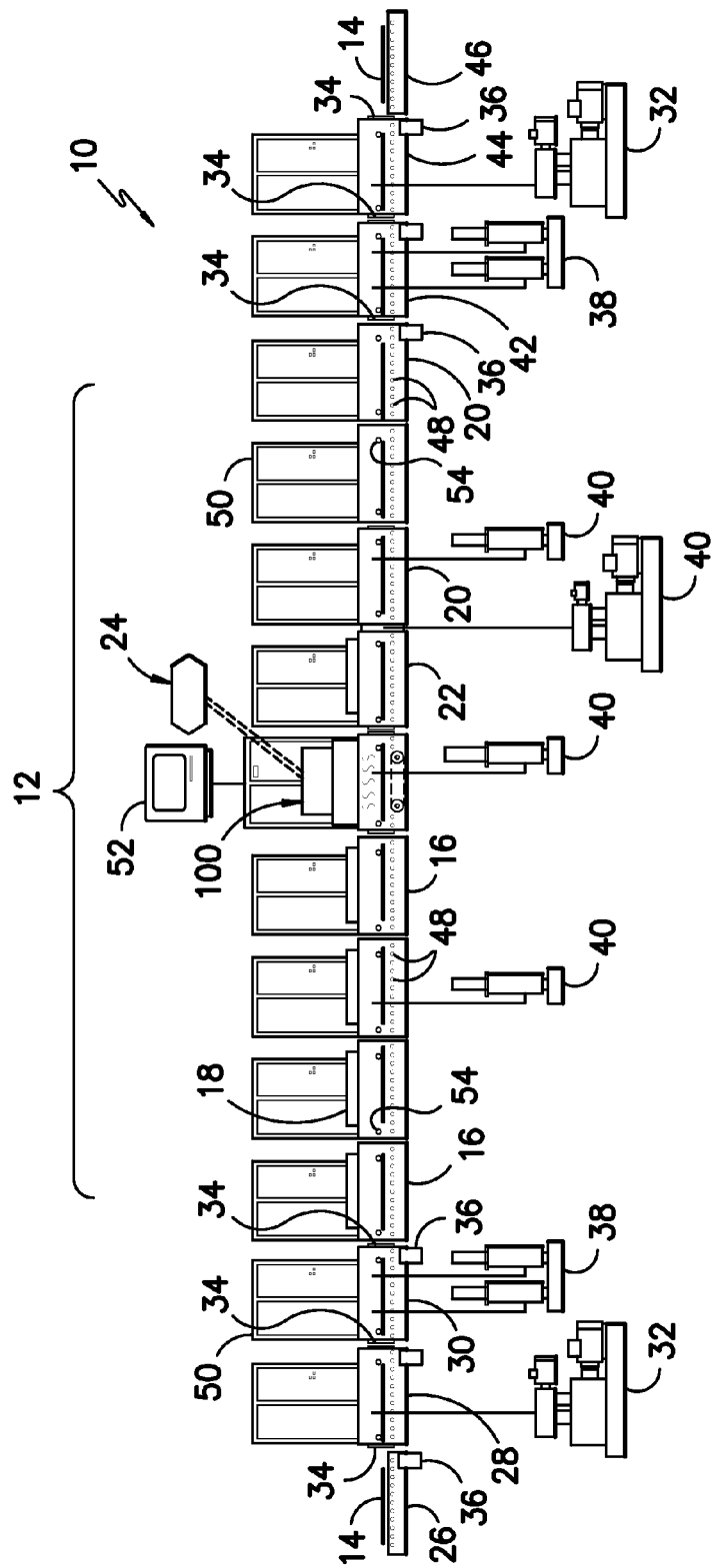
FIG. -1-

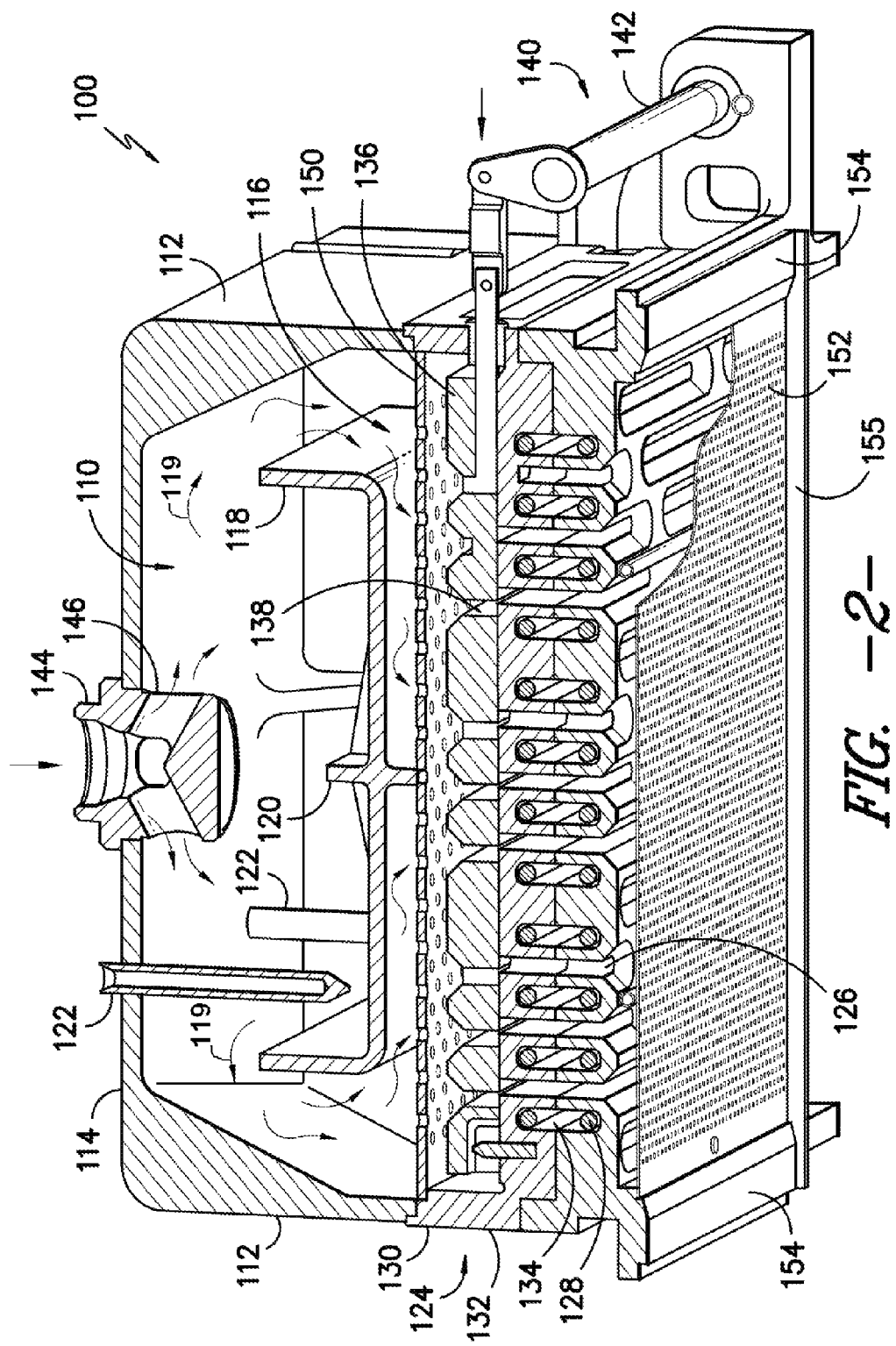
FIG. -2-

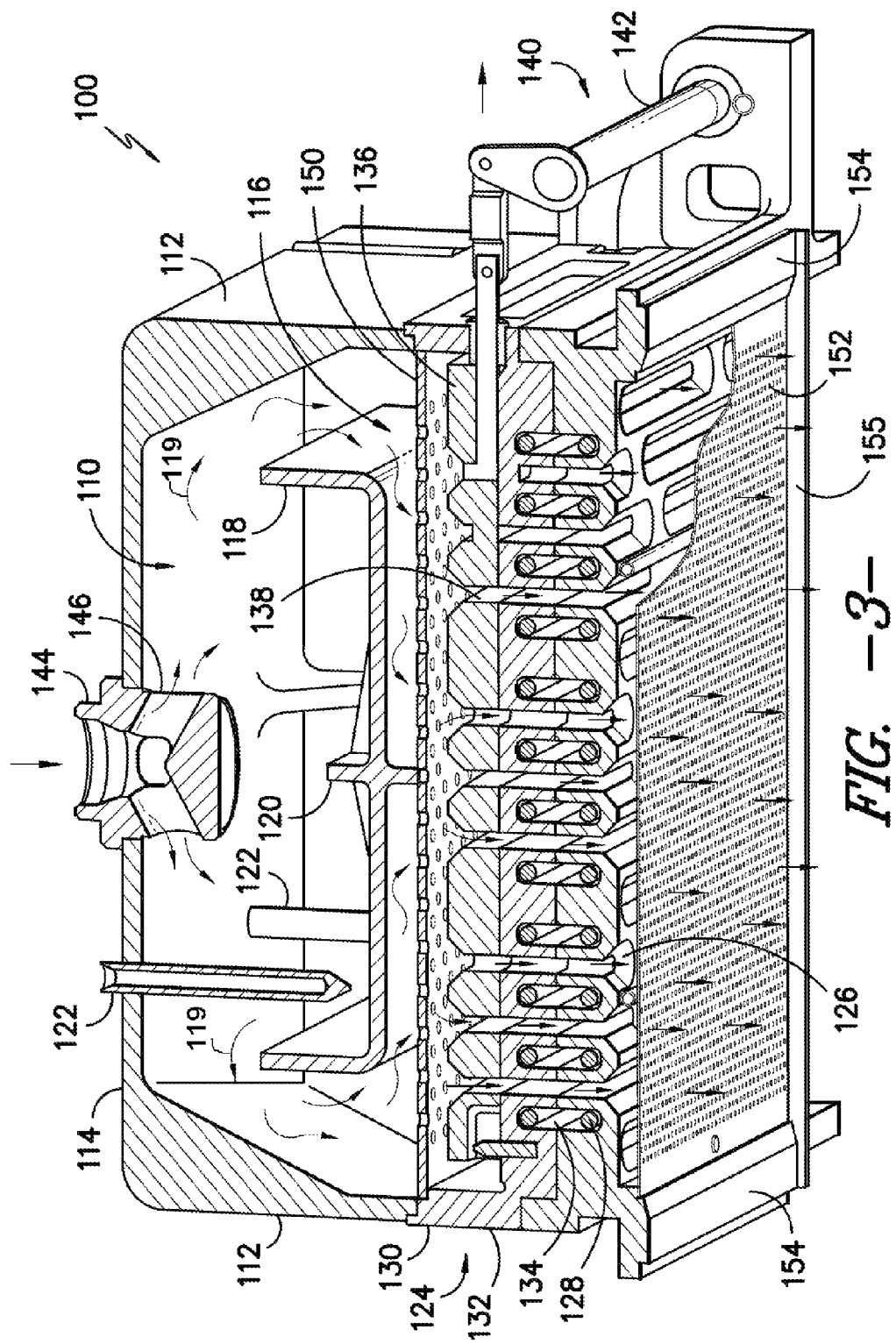
FIG. -3-

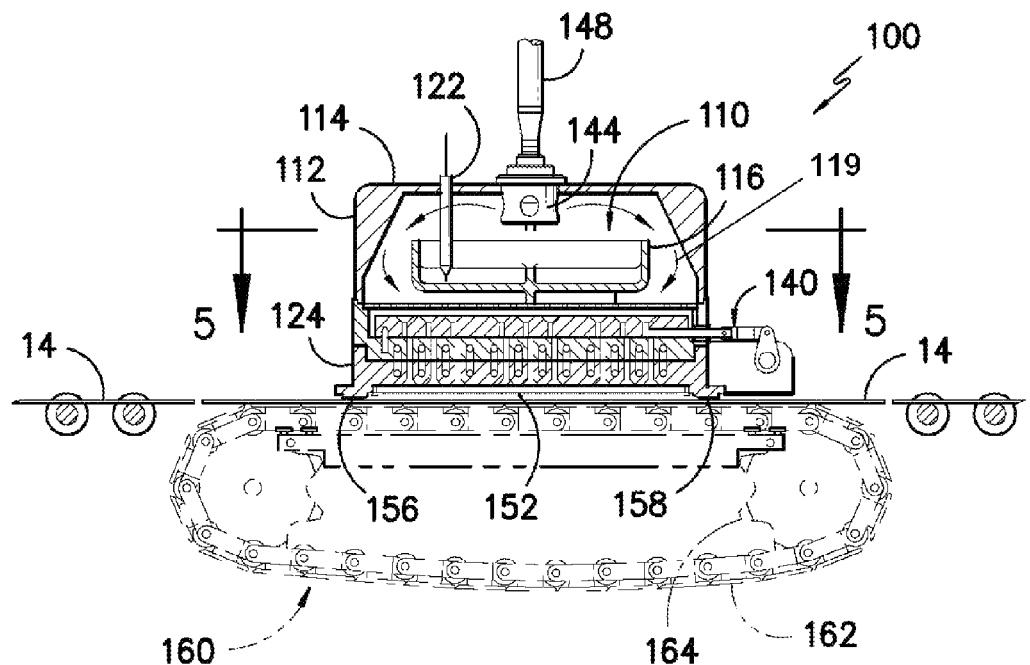
FIG. —4—
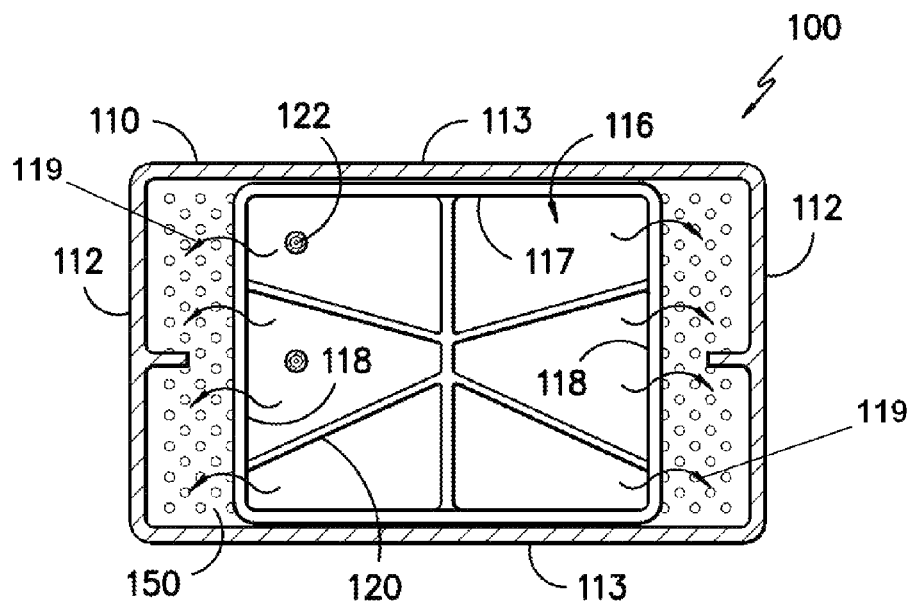
FIG. —5—

VAPOR DEPOSITION APPARATUS AND PROCESS FOR CONTINUOUS DEPOSITION OF A THIN FILM LAYER ON A SUBSTRATE

PRIORITY INFORMATION

The present application claims priority to, and is a divisional application of, U.S. patent application Ser. No. 12/639,043 titled "Vapor Deposition Apparatus and Process for Continuous Deposition of a Thin Film Layer on a Substrate" filed on Dec. 16, 2009 by Rathweg, et al., which is incorporated by reference herein.

FIELD OF THE INVENTION

The subject matter disclosed herein relates generally to the field of thin film deposition processes wherein a thin film layer, such as a semiconductor material layer, is deposited on a substrate. More particularly, the subject matter is related to a vapor deposition apparatus and associated process for depositing a thin film layer of a photo-reactive material on a glass substrate in the formation of photovoltaic (PV) modules.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

Solar energy systems using CdTe PV modules are generally recognized as the most cost efficient of the commercially available systems in terms of cost per watt of power generated. However, the advantages of CdTe not withstanding, sustainable commercial exploitation and acceptance of solar power as a supplemental or primary source of industrial or residential power depends on the ability to produce efficient PV modules on a large scale and in a cost effective manner.

Certain factors greatly affect the efficiency of CdTe PV modules in terms of cost and power generation capacity. For example, CdTe is relatively expensive and, thus, efficient utilization (i.e., minimal waste) of the material is a primary cost factor. In addition, the energy conversion efficiency of the module is a factor of certain characteristics of the deposited CdTe film layer. Non-uniformity or defects in the film layer can significantly decrease the output of the module, thereby adding to the cost per unit of power. Also, the ability to process relatively large substrates on an economically sensible commercial scale is a crucial consideration.

CSS (Closed System Sublimation) is a known commercial vapor deposition process for production of CdTe modules. Reference is made, for example, to U.S. Pat. No. 6,444,043 and U.S. Pat. No. 6,423,565. Within the vapor deposition chamber in a CSS system, the substrate is brought to an opposed position at a relatively small distance (i.e., about 2-3 mm) opposite to a CdTe source. The CdTe material sublimes and deposits onto the surface of the substrate. In the CSS system of U.S. Pat. No. 6,444,043 cited above, the CdTe material is in granular form and is held in a heated receptacle within the vapor deposition chamber. The sublimated material moves through holes in a cover placed over the receptacle and deposits onto the stationary glass surface, which is held at the smallest possible distance (1-2 mm) above the cover frame.

Since the best film quality of a thin film is achieved in a narrow temperature range just below the point at which the film would begin sublimating off faster than it is depositing (e.g., between about 600° C. to about 650° C. for cadmium telluride), it is desired to keep the substrate temperature between this narrow temperature range throughout the CSS process. However, in a CSS process, the cover must be heated to a temperature considerably greater (e.g., about 800° C. when depositing cadmium telluride) than the substrate to ensure that no material deposits and builds up on the cover. Since the cover is hotter than the substrate, the cover will raise the temperature of the substrate through radiation (e.g., heat exchange) from the cover. This temperature gain can result in a gradient of film quality through the thickness of the film, due to a temperature increase of the substrate during the deposition of the thin film. Further, if the temperature gain of the substrate is too high, the film thickness is limited because the substrate may have become too hot to receive any additional material. This would require that the process begin with the substrate at a lower temperature, resulting in the first film deposited being lower in crystalline quality.

Accordingly, there exists an ongoing need in the industry for an improved vapor deposition apparatus and process for economically feasible large scale production of efficient PV modules, particularly CdTe modules. In particular, a need exists for an improved sublimation plate for use in an economically feasible large scale production of efficient PV modules, particularly CdTe modules, in a CSS process.

BRIEF DESCRIPTION OF THE INVENTION

Aspects and advantages of the invention will be set forth in part in the following description, or may be obvious from the description, or may be learned through practice of the invention.

An apparatus is generally provided for vapor deposition of a sublimated source material as a thin film on a photovoltaic (PV) module substrate. In one embodiment, the apparatus can include a deposition head. A receptacle can be disposed in the deposition head and configured for receipt of a granular source material. A heated distribution manifold can be disposed below the receptacle allowing the receptacle to be indirectly heated by the distribution manifold to a degree sufficient to sublimate source material within the receptacle. The heated distribution manifold can define a plurality of passages therethrough. A molybdenum deposition plate can be disposed below the distribution manifold and at a defined distance above a horizontal conveyance plane of an upper surface of a substrate conveyed through the apparatus. The molybdenum distribution plate can also define a pattern of passages therethrough that further distribute the sublimated source material passing through the distribution manifold. The molybdenum distribution plate includes greater than about 75% by weight molybdenum.

A process is also provided for vapor deposition of a sublimated source material to form thin film on a photovoltaic (PV) module substrate. For example, a source material can be supplied to a receptacle within a deposition head. The receptacle can be indirectly heated with a heat source member disposed below the receptacle to sublimate the source material. The sublimated source material can be directed downwardly within the deposition head through the heat source member while individual substrates are conveyed below the heat source member. The sublimated source material that passes through the heat source member can be distributed onto an upper surface of the substrates via a molybdenum distribution plate posited between the upper surface of the substrate and the heat source member such that leading and trailing sections of the substrates in the direction of conveyance are exposed to generally the same vapor deposition conditions to achieve a desired substantially uniform thickness of the thin film layer on the upper surface of the substrates, wherein said molybdenum distribution plate comprises greater than about 75% by weight molybdenum.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWING

A full and enabling disclosure of the present invention, including the best mode thereof, is set forth in the specification, which makes reference to the appended drawings, in which:

FIG. 1 is a plan view of a system that may incorporate embodiments of a vapor deposition apparatus of the present invention;

FIG. 2 is a cross-sectional view of an embodiment of a vapor deposition apparatus according to aspects of the invention in a first operational configuration;

FIG. 3 is a cross-sectional view of the embodiment of FIG. 2 in a second operational configuration;

FIG. 4 is a cross-sectional view of the embodiment of FIG. 2 in cooperation with a substrate conveyor; and, FIG. 5 is a top view of the receptacle component within the embodiment of FIG. 2.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "μm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

FIG. 1 illustrates an embodiment of a system 10 that may incorporate a vapor deposition apparatus 100 (FIGS. 2 through 5) in accordance with embodiments of the invention configured for deposition of a thin film layer on a photovoltaic (PV) module substrate 14 (referred to hereafter as a "substrate"). The thin film may be, for example, a film layer of cadmium telluride (CdTe). As mentioned, it is generally recognized in the art that a "thin" film layer on a PV module substrate is generally less than about 10 microns (μm).

The vapor deposition apparatus 100 includes a distribution plate 152 disposed below the distribution manifold 124 at a defined distance above a horizontal plane of the upper surface of an underlying substrate 14, as depicted in FIG. 4. The distribution plate 152 defines a pattern of passages, such as holes, slits, and the like, therethrough that further distribute the sublimated source material passing through the distribution manifold 124 such that the source material vapors are uninterrupted in the transverse direction. In other words, the pattern of passages are shaped and staggered or otherwise positioned to ensure that the sublimated source material is deposited completely over the substrate in the transverse direction so that longitudinal streaks or stripes of "un-coated" regions on the substrate are avoided.

During use, the deposition plate 152 is heated to a temperature above the temperature of the substrate 14 to ensure that no material deposits and builds up on the deposition plate 152. For example, when depositing a thin film cadmium telluride layer, the substrate 14 may be heated to a substrate temperature between about 550° C. and about 700° C. (e.g., between about 600° C. and about 650° C.) while the deposition plate may be heated to a plate temperature above about 725° C., such as from about 750° C. to about 900° C. (e.g., from about 800° C. to about 850° C.). However, heat transfer between the deposition plate 152 and the substrate 14 may be minimized by controlling the chemical make-up of the deposition plate 152.

According to the present invention, the deposition plate 152 is a molybdenum deposition plate 152. Generally, molybdenum has the sufficient thermal properties to ensure substantially uniform heating throughout the molybdenum deposition plate 152 while minimizing thermal exchange between the molybdenum deposition plate 152 and the substrate 14 during deposition. For example, molybdenum has an extremely high melting point (i.e., about 2623° C.) allowing a molybdenum shield to be heated to extreme temperatures without fear of melting or otherwise damaging the shield. Additionally, molybdenum has a low coefficient of thermal expansion (i.e., about $4.8 \mu \cdot m^{-1} \cdot K^{-1}$ at 25° C.), while having sufficient thermal conductivity (i.e., about $138 \ W \cdot m^{-1} \cdot K^{-1}$ at 26.8° C.), which allows it to remain substantially the same shape upon heating while still providing minimal thermal transfer via radiation to the nearby substrate 14. Molybdenum has an emissivity coefficient of about 0.06 at 38° C., of about 0.08 at 260° C., of about 0.11 at 538° C., and of about 0.18 at 1093° C. As is known in the art, an emissivity coefficient of a surface is calculated according the Stefan-Boltzmann Law comparing the surface with the radiation of heat from a ideal "black body" with the emissivity coefficient e=1 at a given temperature. This emissivity of molybdenum is considerably lower than graphitized carbon, which has an emissivity coefficient of about 0.76 at 100° C., of about 0.75 at 300° C., and about 0.71 at 500° C. Finally, molybdenum has a relatively high resistance to corrosion and wear. Thus, a molybdenum deposition plate 152 can be in use in the deposition head many times, including heating and cooling, to sputter layers in a commercial-scale manufacturing setting.

As used herein, the term "molybdenum deposition plate" refers to deposition plates including greater than about 75% by weight molybdenum, such as greater than about 85% by weight molybdenum. In some embodiments, the molybdenum deposition plate 152 can include greater than about 95% by weight molybdenum, such as from about 97.5% to 100% by weight molybdenum (e.g., greater than about 99.5%). In particular embodiments, the molybdenum deposition plate 152 can consist essentially of molybdenum (i.e., the shield is substantially free from other metals), and, in one particular embodiment, the molybdenum deposition plate 152 can consist of molybdenum (i.e., substantially 100% pure molybdenum).

Accordingly, the actual temperature increase of the substrate 14 in the deposition vapor deposition apparatus 100 having a molybdenum deposition plate 152 can depend on a number of factors. For example, the speed of travel of the substrate 14 through the apparatus 100 affects the length of time the substrate 14 is exposed to the increased temperatures in the vapor deposition apparatus 100 and can affect the temperature gain. However, in particular embodiments where a cadmium telluride layer is formed to a thickness between about 1 and 5 μm, the substrate 14 can increase in temperature no more than about 75° C. during deposition within the vapor deposition apparatus 100, such as from about 10° C. to about 60° C. Put another way, the substrate temperature of the substrate 14 can increase by no more than about 15% of its initial temperature entering the vapor deposition apparatus 100 prior to exiting the vapor deposition apparatus 100, such as from about 2% to about 10%.

It should be appreciated that the present vapor deposition apparatus 100 is not limited to use in the system 10 illustrated in FIG. 1, but may be incorporated into any suitable processing line configured for vapor deposition of a thin film layer onto a PV module substrate 14. For reference and an understanding of an environment in which the vapor deposition apparatus 100 may be used, the system 10 of FIG. 1 is described below, followed by a detailed description of the apparatus 100.

Referring to FIG. 1, the exemplary system 10 includes a vacuum chamber 12 defined by a plurality of interconnected modules, including a plurality of heater modules 16 that define a pre-heat section of the vacuum chamber 12 through which the substrates 14 are conveyed and heated to a desired temperature before being conveyed into the vapor deposition apparatus 100. Each of the modules 16 may include a plurality of independently controlled heaters 18, with the heaters defining a plurality of different heat zones. A particular heat zone may include more than one heater 18.

The vacuum chamber 12 also includes a plurality of interconnected cool-down modules 20 downstream of the vapor deposition apparatus 100. The cool-down modules 20 define a cool-down section within the vacuum chamber 12 through which the substrates 14 having the thin film of sublimated source material deposited thereon are conveyed and cooled at a controlled cool-down rate prior to the substrates 14 being removed from the system 10. Each of the modules 20 may include a forced cooling system wherein a cooling medium, such as chilled water, refrigerant, or other medium, is pumped through cooling coils (not illustrated) configured with the modules 20.

In the illustrated embodiment of system 10, at least one post-heat module 22 is located immediately downstream of the vapor deposition apparatus 100 and upstream of the cool-down modules 20 in a conveyance direction of the substrates. As the leading section of a substrate 14 is conveyed out of the vapor deposition apparatus 100, it moves into the post-heat module 22, which maintains the temperature of the substrate 14 at essentially the same temperature as the trailing portion of the substrate still within the vapor deposition apparatus 100. In this way, the leading section of the substrate 14 is not allowed to cool while the trailing section is still within the vapor deposition apparatus 100. If the leading section of a substrate 14 were allowed to cool as it exited the apparatus 100, a non-uniform temperature profile would be generated longitudinally along the substrate 14. This condition could result in the substrate breaking from thermal stress.

As diagrammatically illustrated in FIG. 1, a feed device 24 is configured with the vapor deposition apparatus 100 to supply source material, such as granular CdTe. The feed device 24 may take on various configurations within the scope and spirit of the invention, and functions to supply the source material without interrupting the continuous vapor deposition process within the apparatus 100 or conveyance of the substrates 14 through the apparatus 100.

Still referring to FIG. 1, the individual substrates 14 are initially placed onto a load conveyor 26, and are subsequently moved into an entry vacuum lock station that includes a load module 28 and a buffer module 30. A "rough" (i.e., initial) vacuum pump 32 is configured with the load module 28 to draw an initial vacuum, and a "fine" (i.e., final) vacuum pump 38 is configured with the buffer module 30 to increase the vacuum in the buffer module 30 to essentially the vacuum pressure within the vacuum chamber 12. Slide gates or valves 34 are operably disposed between the load conveyor 26 and the load module 28, between the load module 28 and the buffer module 30, and between the buffer module 30 and the vacuum chamber 12. These valves 34 are sequentially actuated by a motor or other type of actuating mechanism 36 in order to introduce the substrates 14 into the vacuum chamber 12 in a step-wise manner without affecting the vacuum within the chamber 12.

In operation of the system 10, an operational vacuum is maintained in the vacuum chamber 12 by way of any combination of rough and/or fine vacuum pumps 40. In order to introduce a substrate 14 into the vacuum chamber 12, the load module 28 and buffer module 30 are initially vented (with the slide valve 34 between the two modules in the open position). The slide valve 34 between the buffer module 30 and the first heater module 16 is closed. The slide valve 34 between the load module 28 and load conveyor 26 is opened and a substrate 14 is moved into the load module 28. At this point, the first slide valve 34 is shut and the rough vacuum pump 32 then draws an initial vacuum in the load module 28 and buffer module 30. The substrate 14 is then conveyed into the buffer module 30, and the slide valve 34 between the load module 28 and buffer module 30 is closed. The fine vacuum pump 38 then increases the vacuum in the buffer module 30 to approximately the same vacuum in the vacuum chamber 12. At this point, the slide valve 34 between the buffer module 30 and vacuum chamber 12 is opened and the substrate 14 is conveyed into the first heater module 16.

An exit vacuum lock station is configured downstream of the last cool-down module 20, and operates essentially in reverse of the entry vacuum lock station described above. For example, the exit vacuum lock station may include an exit buffer module 42 and a downstream exit lock module 44. Sequentially operated slide valves 34 are disposed between the buffer module 42 and the last one of the cool-down modules 20, between the buffer module 42 and the exit lock module 44, and between the exit lock module 44 and an exit conveyor 46. A fine vacuum pump 38 is configured with the exit buffer module 42, and a rough vacuum pump 32 is configured with the exit lock module 44. The pumps 32, 38 and slide valves 34 are sequentially operated to move the substrates 14 out of the vacuum chamber 12 in a step-wise fashion without loss of vacuum condition within the vacuum chamber 12.

System 10 also includes a conveyor system configured to move the substrates 14 into, through, and out of the vacuum chamber 12. In the illustrated embodiment, this conveyor system includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensors 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired conveyance rate through the vacuum chamber 12.

FIGS. 2 through 5 relate to a particular embodiment of the vapor deposition apparatus 100. Referring to FIGS. 2 and 3 in particular, the apparatus 100 includes a deposition head 110 defining an interior space in which a receptacle 116 is configured for receipt of a granular source material (not shown). As mentioned, the granular source material may be supplied by a feed device or system 24 (FIG. 1) via a feed tube 148 (FIG. 4). The feed tube 148 is connected to a distributor 144 disposed in an opening in a top wall 114 of the deposition head 110. The distributor 144 includes a plurality of discharge ports 146 that are configured to evenly distribute the granular source material into the receptacle 116. The receptacle 116 has an open top and may include any configuration of internal ribs 120 or other structural elements.

In the illustrated embodiment, at least one thermocouple 122 is operationally disposed through the top wall 114 of the deposition head 110 to monitor temperature within the deposition head 110 adjacent to or in the receptacle 116.

The deposition head 110 also includes longitudinal end walls 112 and side walls 113 (FIG. 5). Referring to FIG. 5 in particular, the receptacle 116 has a shape and configuration such that the end walls 118 are spaced from the end walls 112 of the head chamber 110. The side walls 117 of the receptacle 116 lie adjacent to and in close proximation to the side walls 113 of the deposition head so that very little clearance exists between the respective walls, as depicted in FIG. 5. With this configuration, sublimated source material will flow out of the open top of the receptacle 116 and downwardly over the end walls 118 as leading and trailing curtains of vapor 119 over, as depicted in FIGS. 2, 3, and 5. Very little of the sublimated source material will flow over the side walls 117 of the receptacle 116.

A heated distribution manifold 124 is disposed below the receptacle 116. This distribution manifold 124 may take on various configurations within the scope and spirit of the invention, and serves to indirectly heat the receptacle 116, as well as to distribute the sublimated source material that flows from the receptacle 116. In the illustrated embodiment, the heated distribution manifold 124 has a clam-shell configuration that includes an upper shell member 130 and a lower shell member 132. Each of the shell members 130, 132 includes recesses therein that define cavities 134 when the shell members are mated together as depicted in FIGS. 2 and 3. Heater elements 128 are disposed within the cavities 134 and serve to heat the distribution manifold 124 to a degree sufficient for indirectly heating the source material within the receptacle 116 to cause sublimation of the source material. The heater elements 128 may be made of a material that reacts with the source material vapor and, in this regard, the shell members 130, 132 also serve to isolate the heater elements 128 from contact with the source material vapor. The heat generated by the distribution manifold 124 is also sufficient to prevent the sublimated source material from plating out onto components of the head chamber 110. Desirably, the coolest component in the head chamber 110 is the upper surface of the substrates 14 conveyed therethrough so as to ensure that the sublimated source material plates onto the substrate, and not onto components of the head chamber 110.

Still referring to FIGS. 2 and 3, the heated distribution manifold 124 includes a plurality of passages 126 defined therethrough. These passages have a shape and configuration so as to uniformly distribute the sublimated source material towards the underlying substrates 14 (FIG. 4).

In the illustrated embodiment, the distribution plate 152 is disposed below the distribution manifold 124 at a defined distance above a horizontal plane of the upper surface of an underlying substrate 14, as depicted in FIG. 4. This distance may be, for example, between about 0.3 cm to about 4.0 cm. In a particular embodiment, the distance is about 1.0 cm. The conveyance rate of the substrates below the distribution plate 152 may be in the range of, for example, about 10 mm/sec to about 40 mm/sec. In a particular embodiment, this rate may be, for example, about 20 mm/sec. The thickness of the CdTe film layer that plates onto the upper surface of the substrate 14 can vary within the scope and spirit of the invention, and may be, for example, between about 1 micron to about 5 microns. In a particular embodiment, the film thickness may be about 3 microns. The distribution plate 152 is a molybdenum distribution plate 152 as described in greater detail above.

As previously mentioned, a significant portion of the sublimated source material will flow out of the receptacle 116 as leading and trailing curtains of vapor 119, as depicted in FIG. 5. Although these curtains of vapor 119 will diffuse to some extent in the longitudinal direction prior to passing through the distribution plate 152, it should be appreciated that it is unlikely that a uniform distribution of the sublimated source material in the longitudinal direction will be achieved. In other words, more of the sublimated source material will be distributed through the longitudinal end sections of the distribution plate 152 as compared to the middle portion of the distribution plate. However, as discussed above, because the system 10 conveys the substrates 14 through the vapor deposition apparatus 100 at a constant (non-stop) linear speed, the upper surfaces of the substrates 14 will be exposed to the same deposition environment regardless of any non-uniformity of the vapor distribution along the longitudinal aspect of the apparatus 100. The passages 126 in the distribution manifold 124 and the holes in the distribution plate 152 ensure a relatively uniform distribution of the sublimated source material in the transverse aspect of the vapor deposition apparatus 100. So long as the uniform transverse aspect of the vapor is maintained, a relatively uniform thin film layer is deposited onto the upper surface of the substrates 14 regardless of any non-uniformity in the vapor deposition along the longitudinal aspect of the apparatus 100.

As illustrated in the figures, it may be desired to include a debris shield 150 between the receptacle 116 and the distribution manifold 124. This shield 150 includes holes defined therethrough (which may be larger or smaller than the size of the holes of the distribution plate 152) and primarily serves to retain any granular or particulate source material from passing through and potentially interfering with operation of the movable components of the distribution manifold 124, as discussed in greater detail below. In other words, the debris shield 150 can be configured to act as a breathable screen that inhibits the passage of particles without substantially interfering with vapors 119 flowing through the shield 150.

Referring to FIGS. 2 through 4 in particular, apparatus 100 desirably includes transversely extending seals 154 at each longitudinal end of the head chamber 110. In the illustrated embodiment, the seals define an entry slot 156 and an exit slot 158 at the longitudinal ends of the head chamber 110. These seals 154 are disposed at a distance above the upper surface of the substrates 14 that is less than the distance between the surface of the substrates 14 and the distribution plate 152, as is depicted in FIG. 4. The seals 154 help to maintain the sublimated source material in the deposition area above the substrates. In other words, the seals 154 prevent the sublimated source material from "leaking out" through the longitudinal ends of the apparatus 100. It should be appreciated that the seals 154 may be defined by any suitable structure. In the illustrated embodiment, the seals 154 are actually defined by components of the lower shell member 132 of the heated distribution manifold 124. It should also be appreciated that the seals 154 may cooperate with other structure of the vapor deposition apparatus 100 to provide the sealing function. For example, the seals may engage against structure of the underlying conveyor assembly in the deposition area.

Any manner of longitudinally extending seal structure 155 may also be configured with the apparatus 100 to provide a seal along the longitudinal sides thereof. Referring to FIGS. 2 and 3, this seal structure 155 may include a longitudinally extending side member that is disposed generally as close as reasonably possible to the upper surface of the underlying convey surface so as to inhibit outward flow of the sublimated source material without frictionally engaging against the conveyor.

Referring to FIGS. 2 and 3, the illustrated embodiment includes a movable shutter plate 136 disposed above the distribution manifold 124. This shutter plate 136 includes a plurality of passages 138 defined therethrough that align with the passages 126 in the distribution manifold 124 in a first operational position of the shutter plate 136 as depicted in FIG. 3. As can be readily appreciated from FIG. 3, in this operational position of the shutter plate 136, the sublimated source material is free to flow through the shutter plate 136 and through the passages 126 in the distribution manifold 124 for subsequent distribution through the plate 152. Referring to FIG. 2, the shutter plate 136 is movable to a second operational position relative to the upper surface of the distribution manifold 124 wherein the passages 138 in the shutter plate 136 are misaligned with the passages 126 in the distribution manifold 124. In this configuration, the sublimated source material is blocked from passing through the distribution manifold 124, and is essentially contained within the interior volume of the head chamber 110. Any suitable actuation mechanism, generally 140, may be configured for moving the shutter plate 136 between the first and second operational positions. In the illustrated embodiment, the actuation mechanism 140 includes a rod 142 and any manner of suitable linkage that connects the rod 142 to the shutter plate 136. The rod 142 is rotated by any manner of mechanism located externally of the head chamber 110.

The shutter plate 136 configuration illustrated in FIGS. 2 and 3 is particularly beneficial in that, as desired, the sublimated source material can be quickly and easily contained within the head chamber 110 and prevented from passing through to the deposition area above the conveying unit. This may be desired, for example, during start up of the system 10 while the concentration of vapors 119 within the head chamber builds to a sufficient degree to start the deposition process. Likewise, during shutdown of the system, it may be desired to maintain the sublimated source material within the head chamber 110 to prevent the material from condensing on the conveyor or other components of the apparatus 100.

Referring to FIG. 4, the vapor deposition apparatus 100 may further comprise a conveyor 160 disposed below the head chamber 110. This conveyor 160 may be uniquely configured for the deposition process as compared to the conveyors 48 discussed above with respect to the system 10 of FIG. 1. For example, the conveyor 160 may be a self-contained conveying unit that includes a continuous loop conveyor on which the substrates 14 are supported below the distribution plate 152. In the illustrated embodiment, the conveyor 160 is defined by a plurality of slats 162 that provide a flat, unbroken (i.e., no gaps between the slats) support surface for the substrates 14. The slat conveyor is driven in an endless loop around sprockets 164. It should be appreciated, however, that the invention is not limited to any particular type of conveyor 160 for moving the substrates 14 through the vapor deposition apparatus 100.

The present invention also encompasses various process embodiments for vapor deposition of a sublimated source material to form a thin film on a PV module substrate. The various processes may be practiced with the system embodiments described above or by any other configuration of suitable system components. It should thus be appreciated that the process embodiments according to the invention are not limited to the system configuration described herein.

In a particular embodiment, the vapor deposition process includes supplying source material to a receptacle within a deposition head, and indirectly heating the receptacle with a heat source member to sublimate the source material. The sublimated source material is directed out of the receptacle and downwardly within the deposition head through the heat source member. Individual substrates are conveyed below the heat source member. The sublimated source material that passes through the heat source is distributed onto an upper surface of the substrates such that leading and trailing sections of the substrates in the direction of conveyance thereof are exposed to the same vapor deposition conditions so as to achieve a desired uniform thickness of the thin film layer on the upper surface of the substrates.

In a unique process embodiment, the sublimated source material is directed from the receptacle primarily as transversely extending leading and trailing curtains relative to the conveyance direction of the substrates. The curtains of sublimated source material are directed downwardly through the heat source member towards the upper surface of the substrates. These leading and trailing curtains of sublimated source material may be longitudinally distributed to some extent relative to the conveyance direction of the substrates after passing through the heat source member.

In yet another unique process embodiment, the passages for the sublimated source material through the heat source may be blocked with an externally actuated blocking mechanism, as discussed above.

Desirably, the process embodiments include continuously conveying the substrates at a substantially constant linear speed during the vapor deposition process.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A process for vapor deposition of a sublimated source material to form thin film on a photovoltaic (PV) module substrate, the process comprising:
    supplying source material to a receptacle within a deposition head;
    indirectly heating the receptacle with a heat source member disposed below the receptacle to sublimate the source material;
    directing the sublimated source material downwardly within the deposition head through the heat source member;
    conveying individual substrates below the heat source member; and,
    distributing the sublimated source material that passes through the heat source member onto an upper surface of the substrates via a molybdenum distribution plate posited between the upper surface of the substrate and the heat source member, wherein said molybdenum distribution plate comprises greater than about 75% by weight molybdenum.

2. The process as in claim 1, wherein leading and trailing sections of the substrates in the direction of conveyance are exposed to generally the same vapor deposition conditions to achieve a desired substantially uniform thickness of the thin film layer on the upper surface of the substrates.

3. The process as in claim 1, wherein said molybdenum distribution plate comprises greater than about 95% by weight molybdenum.

4. The process as in claim 1, wherein said molybdenum distribution plate consists essentially of molybdenum.

5. The process as in claim 1, wherein said molybdenum distribution plate consists of molybdenum.

6. The process as in claim 1, wherein the substrates are continuously conveyed at a substantially constant linear conveyance rate during the vapor deposition process.

7. The process as in claim 1, further comprising:
    heating the individual substrates to a substrate temperature prior to conveying individual substrates below the heat source member.

8. The process as in claim 7, wherein the substrate temperature is between about 550° C. and about 700° C.

9. The process as in claim 7, wherein the substrate temperature is between about 600° C. and about 650° C.

10. The process as in claim 8, further comprising:
    heating the molybdenum deposition plate to a plate temperature prior to distributing the sublimated source material that passes through the heat source member onto the upper surface of the substrates via the molybdenum distribution plate.

11. The process as in claim 10, wherein the plate temperature is above about 725° C.

12. The process as in claim 10, wherein the plate temperature is from about 750° C. to about 900° C.

13. The process as in claim 10, wherein the plate temperature is from about 800° C. to about 850° C.

14. The process as in claim 10, wherein the source material comprises cadmium telluride.

15. The process as in claim 14, wherein distributing the sublimated source material that passes through the heat source member onto the upper surface of the substrates via the molybdenum distribution plate forms a cadmium telluride layer on the upper surface that has a thickness between about 1 μm and 5 μm.

16. The process as in claim 1, further comprising:
    heating the individual substrates to a substrate temperature prior to conveying individual substrates below the heat source member; and
    heating the molybdenum deposition plate to a plate temperature prior to distributing the sublimated source material that passes through the heat source member onto the upper surface of the substrates via the molybdenum distribution plate.

17. The process as in claim 16, wherein the substrate temperature increases no more than about 75° C. during deposition within the vapor deposition apparatus 100.

18. The process as in claim 16, wherein the substrate temperature increases from about 10° C. to about 60° C. during deposition within the vapor deposition apparatus 100.

19. The process as in claim 16, wherein the substrate temperature increases no more than about 15% of its initial temperature entering the vapor deposition apparatus 100 prior to exiting the vapor deposition apparatus 100.

20. The process as in claim 16, wherein the substrate temperature increases from about 2% to about 10% of its initial temperature entering the vapor deposition apparatus 100 prior to exiting the vapor deposition apparatus 100.

* * * * *